United States Patent
Kitaoka et al.

(10) Patent No.: US 6,845,113 B2
(45) Date of Patent: Jan. 18, 2005

(54) COHERENT LIGHT SOURCE AND RECORDING/REPRODUCING APPARATUS USING THE SAME

(75) Inventors: Yasuo Kitaoka, Ibaraki (JP); Ken'ichi Kasazumi, Takatsuki (JP); Kazuhisa Yamamoto, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/041,780

(22) Filed: Oct. 24, 2001

(65) Prior Publication Data

US 2002/0061033 A1 May 23, 2002

(30) Foreign Application Priority Data

Oct. 31, 2000 (JP) ........................................ 2000-332037

(51) Int. Cl.[7] .............................. H01S 3/30; H01S 3/00; H01S 3/10
(52) U.S. Cl. ................................ 372/38; 372/22; 372/5
(58) Field of Search .............................. 372/5, 22, 38, 372/96, 98, 30, 9, 31, 32; 250/330; 438/106; 385/49

(56) References Cited

U.S. PATENT DOCUMENTS

| | | | | | |
|---|---|---|---|---|---|
| 3,927,945 A | * | 12/1975 | Bates | ........................ | 356/491 |
| 4,939,388 A | * | 7/1990 | Eaton et al. | ................ | 359/328 |
| 5,202,741 A | * | 4/1993 | Snyder | ........................ | 250/330 |
| 5,237,636 A | | 8/1993 | Harada | ........................ | 385/122 |
| 5,301,059 A | | 4/1994 | Kitaoka et al. | | |
| 5,835,650 A | * | 11/1998 | Kitaoka et al. | ................ | 385/49 |
| 5,936,985 A | * | 8/1999 | Yamamoto et al. | ........... | 372/31 |
| 5,960,259 A | * | 9/1999 | Kitaoka et al. | ............. | 438/106 |
| 6,067,393 A | * | 5/2000 | Kitaoka et al. | ............... | 385/49 |
| 6,069,904 A | | 5/2000 | Kitaoka et al. | | |
| 6,370,169 B1 | * | 4/2002 | Imajuku et al. | ............... | 372/32 |

FOREIGN PATENT DOCUMENTS

| | | |
|---|---|---|
| JP | 5-165388 | 7/1993 |
| JP | 3036254 | 2/2000 |

OTHER PUBLICATIONS

"Milliwatt–order blue–light generation in a periodically domain–inverted LiTaO$_3$ waveguide"; Yamamoto et al.; Optical Letters, vol. 16, No. 15, pp 1156–1158, Aug. 1, 1991.

"Holographic Data Storage"; Holographic memories, California Institute of Technology; The 1st Optware Meeting on Jun. 19, 2000.

* cited by examiner

*Primary Examiner*—Don Wong
*Assistant Examiner*—Hung Tran Vy
(74) *Attorney, Agent, or Firm*—Merchant & Gould P.C.

(57) ABSTRACT

It is an object of the present invention to provide a short-wavelength coherent light source that includes a semiconductor laser and a wavelength converting device and is controlled to have a desired wavelength. The coherent light source includes the following: a semiconductor laser having a first wavelength; an optical waveguide-type QPM-SHG device used as a wavelength converting device for converting the wavelength of the semiconductor laser by half; a wavelength separating function; a diffraction grating; and a photo-detector. The semiconductor laser beam acting as fundamental light is separated with the wavelength separating function, and the wavelength is controlled with the diffraction grating. Thus, the wavelength of harmonic light generated by wavelength conversion is controlled to a desired wavelength.

22 Claims, 13 Drawing Sheets

COHERENT LIGHT SOURCE AND RECORDING/REPRODUCING APPARATUS USING THE SAME

BACKGROUND OF THE INVENTION

1. Field of the Invention

The present invention relates to a coherent light source that includes a semiconductor laser and a wavelength converting device and is employed, e.g., in the fields of optical information processing and optical measurement and to a recording/reproducing apparatus using the coherent light source.

2. Description of the Related Art

A small short-wavelength light source is necessary to achieve high-density optical disks and high-accuracy optical measurement. In particular, a recording/reproducing system using a hologram has drawn attention as a next-generation high-density optical disk because a recording density in the 100 Gbit/inch$^2$ range can be expected.

FIG. 12 shows the schematic configuration of a conventional holographic optical information recording/reproducing system. This is, e.g., an optical system for optical disks that employs shift-multiplex recording proposed by Psaltis et al.

As shown in FIG. 12, a laser beam emitted from a laser light source 46 passes through a beam expander 47, where the beam diameter is expanded, and is divided by a half mirror 48. Consequently, the beam deflected in one direction passes through a spatial light modulator (hereinafter, referred to as "SLM") 49 and is focused on a hologram disk 51 by a Fourier transform lens 50 so as to become a signal beam. The beam deflected in the other direction is converted through an aperture 52 into a beam having an appropriate diameter that acts as a reference beam, with which the same position of the signal beam on the hologram disk 51 is irradiated. The hologram disk 51 includes two glass substrates and a hologram medium, such as a photopolymer, sealed between the glass substrates. The interference fringes generated by the signal beam and the reference beam are recorded on the hologram disk 51.

The SLM 49 includes a two-dimensional array of light switches, each of which is turned on and off separately in response to the input signal to be recorded. For example, the SLM having 1024×1024 cells can display information of 1 Mbit at the same time. The information of 1 Mbit displayed on the SLM 49 by the signal beam passing through it is converted into a two-dimensional array of light beams, which then is recorded on the hologram disk 51 as interference fringes. For reproduction of the recorded signal, the hologram disk 51 is irradiated with the reference beam alone, and the diffracted light from the hologram is received by a CCD device 53.

The holographic optical recording system uses a hologram medium having a large thickness of about 1 mm and records the interference fringes as a thick grating, i.e., a so-called Bragg grating, thereby enabling angular-multiplex recording. The system in FIG. 12 can achieve angular multiplexing by shifting the position irradiated with the reference beam of spherical wave instead of changing the angle of incidence of the reference beam. Specifically, the multiplex recording is performed in such a manner that the hologram disk 51 is rotated slightly so as to shift the recorded position, causing a small change in the angle of incidence of the reference beam detected by each portion of the hologram medium.

The angular selectivity that depends on the intensity of a reproduced signal for a hologram medium having a thickness of 1 mm is as follows: the full-width at half-maximum is 0.014 degrees; the holograms are multiplexed at intervals of about 20 μm when NA for the reference beam is 0.5. This makes it possible to achieve a recording density of 200 Gbit/inch$^2$, which is 300 GB in terms of a 12 cm-disk capacity.

Since the Bragg grating has angular selectivity and wavelength selectivity, the wavelength of a light source during recording and reproducing has to be controlled. For the hologram medium having a thickness of 1 mm, the wavelength selectivity of the grating is 0.24 nm.

To achieve a high-density optical information recording/reproducing system as described above, a small stable laser light source and a recording medium for multiplex recording are important technologies. Generally, a solid laser (e.g., a YAG laser) or a gas laser (e.g., an Ar laser) is used as a laser light source because an absolute value of the oscillation wavelength is stable.

As a small short-wavelength light source, a coherent light source has drawn attention. The coherent light source includes a semiconductor laser and an optical waveguide-type second harmonic generation (hereinafter, referred to as "SHG") device employing quasi-phase-matching (hereinafter, referred to as "QPM"), i.e., an optical waveguide-type QPM-SHG device (see Yamamoto et al., Optics Letters Vol. 16, No. 15, 1156 (1991)).

FIG. 13 shows the schematic configuration of an SHG blue light source including an optical waveguide-type QPM-SHG device. As shown in FIG. 13, a wavelength-variable distributed Bragg reflection (hereinafter, referred to as "DBR") semiconductor laser 54 having a DBR region is used as a semiconductor laser. The semiconductor laser 54 is a 0.85 μm-band 100 mW-class AlGaAs wavelength-variable DBR semiconductor laser and includes an active region 56, a phase control region 57, and a DBR region 58. The oscillation wavelength of the semiconductor laser 54 can be varied continuously by changing the current to be input to the phase control region 57 and the DBR region 58 simultaneously.

An optical waveguide-type QPM-SHG device 55 used as a wavelength converting device includes an X-cut MgO-doped LiNbO$_3$ substrate 59, an optical waveguide 60, and a periodic polarization inversion region 61. The optical waveguide 60 and the periodic polarization inversion region 61 are formed on the substrate 59. The optical waveguide 60 is produced by proton exchange in pyrophosphoric acid. The periodic polarization inversion region 61 is produced by forming comb-shaped electrodes on the substrate 59 and applying an electric field to those electrodes.

In the SHG blue light source shown in FIG. 13, when the laser output is 100 mW, a laser beam of 60 mW is coupled to the optical waveguide 60. The oscillation wavelength of the semiconductor laser 54 is fixed within the phase-matching wavelength tolerance of the QPM-SHG device 55 (i.e., the wavelength converting device) by controlling the amount of current to be input to the phase control region 57 and the DBR region 58 of the semiconductor laser 54. This SHG blue light source provides blue light of about 10 mW having a wavelength of 425 nm. The blue light has diffraction limited focusing properties when its transverse mode is a TE$_{00}$ mode and reduced noise performance, i.e., −140 dB/Hz or less in relative noise field intensity.

As described above, in a holographic optical recording system, the diffraction patterns to be recorded are changed with the incidence direction and wavelength of light. Therefore, when the wavelength of light for recording is different from that for reproduction, cross-talk signals are increased and the signal beam intensity is degraded.

Information stored on the hologram disk 51 shown in FIG. 12 is reproduced as Bragg diffracted light from the interference fringes recorded. To reproduce the information with a sufficient quantity of light, it is necessary to meet the Bragg conditions. Specifically, the angle of incidence of a reference beam with respect to the hologram medium and the wavelength thereof each have to be adjusted to an optimum value.

For example, assuming that the system includes a hologram medium with a thickness of 1 mm, a light source with a wavelength of 515 nm and interference fringes with a period of 0.5 $\mu$m, the wavelength tolerance of a reference beam under the Bragg conditions is 515 nm±0.24 nm, which is defined by a wavelength at which the diffraction efficiency is reduced by half.

Moreover, thermal expansion of the hologram medium has to be taken into consideration because it causes a change in the period of the interference fringes recorded and a variation in the optimum wavelength of the reproducing light that meets the Bragg conditions.

The following is an explanation of an example where OmniDex 352, i.e., a photopolymer manufactured by Dupont, is used as a hologram medium. The linear thermal expansion coefficient of the hologram medium is $7.1 \times 10^{-5}$ (see JP 5(1993)-16538 A). The amount of variation in the optimum wavelength over the range of temperature change of 25° C. is 0.18%, which is 515+0.9 nm in terms of the oscillation wavelength of an Ar laser. This value is more than three times the wavelength tolerance of 515±0.24 nm that meets the Bragg conditions. To achieve stable hologram reproduction over the range of temperature change of the hologram medium, it is necessary to control the wavelength of a light source for reproduction optimally according to a change in temperature of the hologram medium during reproducing.

SUMMARY OF THE INVENTION

Therefore, with the foregoing in mind, it is an object of the present invention to provide a short-wavelength coherent light source that includes a semiconductor laser and a wavelength converting device and is controlled to have a desired wavelength, and a recording/reproducing apparatus using the same.

A coherent light source according to a first configuration of the present invention includes fundamental light having a first wavelength and a wavelength converting device for converting the wavelength of the fundamental light by half. The wavelength converting device converts the fundamental light into harmonic light having a second wavelength. The wavelength of the harmonic light is controlled in such a manner that the wavelength of the fundamental light is detected and controlled to a desired wavelength.

In the first configuration of the coherent light source of the present invention, it is preferable that the fundamental light is emitted from a semiconductor laser having a wavelength-variable function. In this case, it is preferable that the semiconductor laser includes an active region, a phase control region and a distributed Bragg reflection (DBR) region. Moreover, it is preferable that the desired wavelength is within a phase-matching wavelength tolerance of the wavelength converting device, and that a variation in wavelength of the fundamental light with a change in operating current thereof is compensated by changing the current to be input to the phase control region or the DBR region.

A coherent light source according to a second configuration of the present invention includes fundamental light having a first wavelength and a wavelength converting device for converting the wavelength of the fundamental light by half. The wavelength converting device converts the fundamental light into harmonic light having a second wavelength. A first mechanism that detects the wavelength of the fundamental light and controls it to a desired wavelength and a second mechanism that controls a phase-matching wavelength of the wavelength converting device to the wavelength of the fundamental light are provided to control the wavelength and output of the harmonic light.

In the first or the second configuration of the coherent light source of the present invention, it is preferable that the wavelength of the fundamental light that has passed through the wavelength converting device is detected so as to be controlled to the desired wavelength.

In the first or the second configuration of the coherent light source of the present invention, it is preferable that a means for separating the fundamental light and the harmonic light and detecting only the fundamental light is provided on an optical path through which light generated by wavelength conversion with the wavelength converting device travels.

In the first or the second configuration of the coherent light source of the present invention, it is preferable that the coherent light source further includes a diffraction grating and a photo-detector, and that the photo-detector detects the fundamental light diffracted by the diffraction grating. In this case, it is preferable that the wavelength converting device has an optical waveguide, and that the diffraction grating is formed on the optical waveguide. This preferred example eliminates the need for components such as a reflecting diffraction grating and a wavelength separating function. Therefore, a small wavelength stabilization mechanism can be achieved at low cost. Moreover, it is preferable that the photo-detector is provided on one side of a substrate on which the optical waveguide is formed. It is preferable that the photo-detector detects the position of the fundamental light diffracted by the diffraction grating. It is preferable that the diffraction grating is formed as a chirped grating whose grating pitch is changed depending on location.

In the first or the second configuration of the coherent light source of the present invention, it is preferable that the coherent light source further includes a cesium (Cs) gas cell and a photo-detector, and that the photo-detector detects the fundamental light that has passed through the Cs gas cell.

In the second coherent light source of the present invention, it is preferable that the phase-matching wavelength of the wavelength converting device is varied by changing a refractive index of the wavelength converting device with electrooptic effect or temperature change.

A recording/reproducing apparatus according to a first configuration of the present invention includes the coherent light source of the present invention. The coherent light source is adjusted to have an optimum wavelength that meets the Bragg conditions in reproducing hologram information recorded on a medium.

A recording/reproducing apparatus according to a second configuration of the present invention includes the coherent light source of the present invention and an optical system for focusing light emitted from the coherent light source on an information medium.

According to the present invention, it is possible to vary the wavelength of harmonic light arbitrarily. The practical effect of using the present invention as a light source for an apparatus that requires an absolute wavelength, such as a holographic memory, is great because the wavelength is stable as well as variable.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described more specifically by way of embodiments.

A coherent light source of this embodiment includes a fundamental light source having a first wavelength and a wavelength converting device for converting the wavelength of the fundamental by half, i.e., a second harmonic generation (hereinafter, referred to as "SHG") device. In particular, the configuration that uses an 800 nm-band near-infrared semiconductor laser as a fundamental light source to obtain light between blue and purple as a harmonic will be described in each of the following embodiments.

First Embodiment

Figure 1:
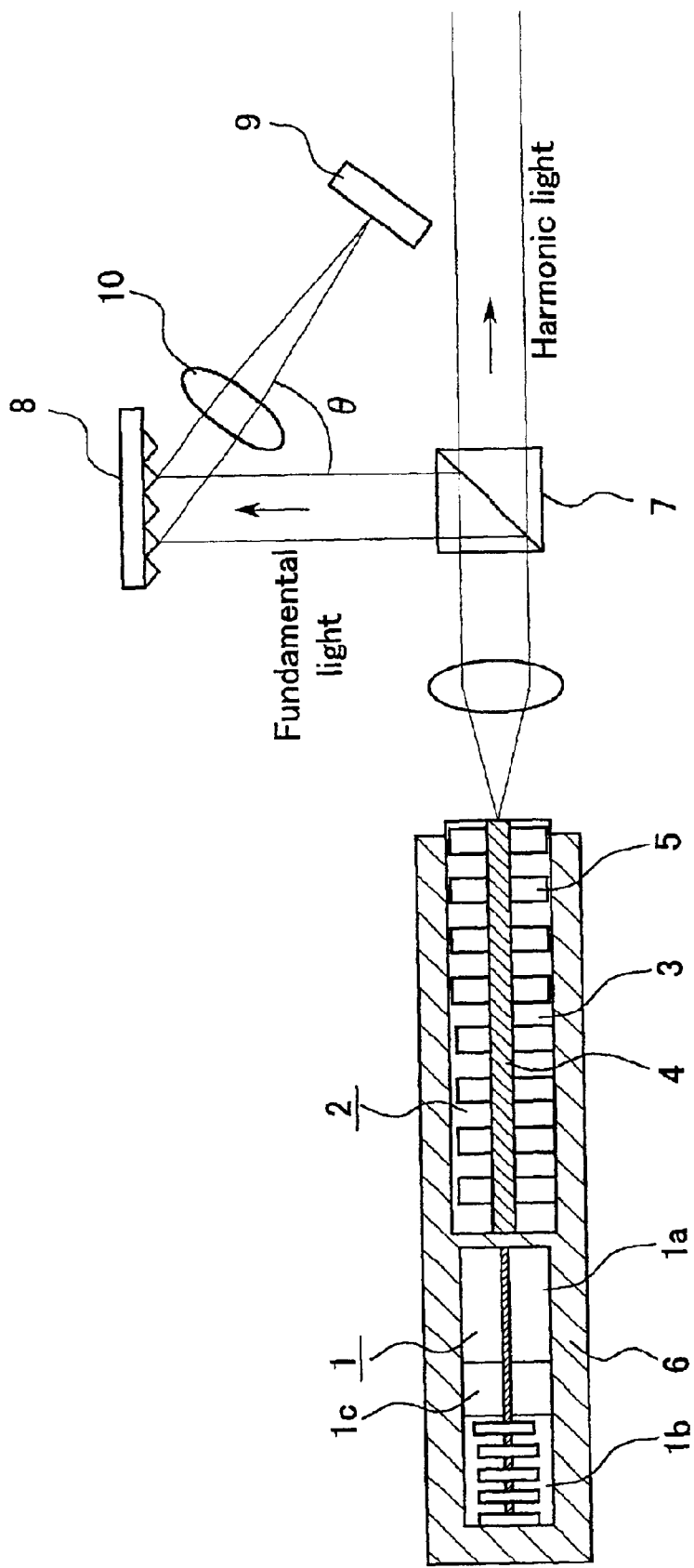
FIG. 1 is a schematic diagram showing the configuration of a coherent light source according to a first embodiment of the present invention.

FIG. 1 is a schematic diagram showing the configuration of a coherent light source according to a first embodiment of the present invention.

As shown in FIG. 1, a semiconductor laser 1 used as a fundamental light source is an AlGaAs wavelength-variable distributed Bragg reflection (hereinafter, referred to as "DBR") semiconductor laser having an output power of 100 mW and a wavelength of 820 nm. The semiconductor laser 1 includes an active region 1a, a DBR region 1b, and a phase control region 1c. The oscillation wavelength can be varied by the input of current to the DBR region 1b and the phase control region 1c at a constant ratio.

An optical waveguide-type SHG device employing quasi-phase-matching (hereinafter, referred to as "QPM"), i.e., an optical waveguide-type QPM-SHG device 2, is used as a wavelength converting device. The QPM-SHG device 2 can utilize larger nonlinear optical constants and provide a long interaction length as an optical waveguide, thus achieving high conversion efficiency. The QPM-SHG device 2 includes an X-cut MgO-doped $LiNbO_3$ substrate 3, an optical waveguide 4, and a periodic polarization inversion region 5 perpendicular to the optical waveguide 4. The optical waveguide 4 and the periodic polarization inversion region 5 are formed on the substrate 3. The optical waveguide 4 is produced by proton exchange in pyrophosphoric acid. The periodic polarization inversion region 5 is produced by forming comb-shaped electrodes on the substrate 3 and applying an electric field to those electrodes.

The semiconductor laser 1 and the QPM-SHG device 2 are formed integrally on a Si sub-mount 6, and their temperatures are controlled by a Peltier element. The semiconductor laser beam, acting as fundamental light, is coupled directly to the optical waveguide 4 of the QPM-SHG device 2 without passing through a lens. When the laser output is 100 mW, a laser beam of 60 mW is coupled to the optical waveguide 4. The oscillation wavelength of the semiconductor laser 1 is fixed to a phase-matching wavelength of the QPM-SHG device (i.e., the wavelength converting device) 2 of 820 nm by controlling the amount of current to be input to the DBR region 1b and the phase control region 1c of the semiconductor laser (i.e., the wavelength-variable DBR semiconductor laser) 1. This coherent light source provides blue light of about 10 mW having a wavelength of 410 nm. The wavelength tolerance for phase matching is 0.1 nm, given by a full-width at half-maximum of the output of the blue light.

As shown in FIG. 1, the fundamental light and the harmonic light emitted from the optical waveguide 4 are separated with a wavelength separating function 7. The fundamental light thus separated is directed to a reflecting diffraction grating 8, and its primary diffracted light is focused on a photo-detector 9 through a condenser lens 10. A diffraction grating having a pitch d of 1000 groove/mm (=1/d) is used as the reflecting diffraction grating 8. A condenser lens having a focal distance f of 50 mm is used as the condenser lens 10. The angle of diffraction θ with respect to light having a wavelength λ is defined by $$\lambda = d \cdot \sin\theta. \qquad \text{Eq. 1}$$

The amount of change in spot position δx on the surface where light is focused is expressed by $$\delta x = f \cdot \theta. \qquad \text{Eq. 2}$$

The amount of change in spot position for a wavelength variation of 820 nm±0.04 nm is given by δx=±50 mm×0.00007, resulting in ±3.5 μm.

Figure 2:
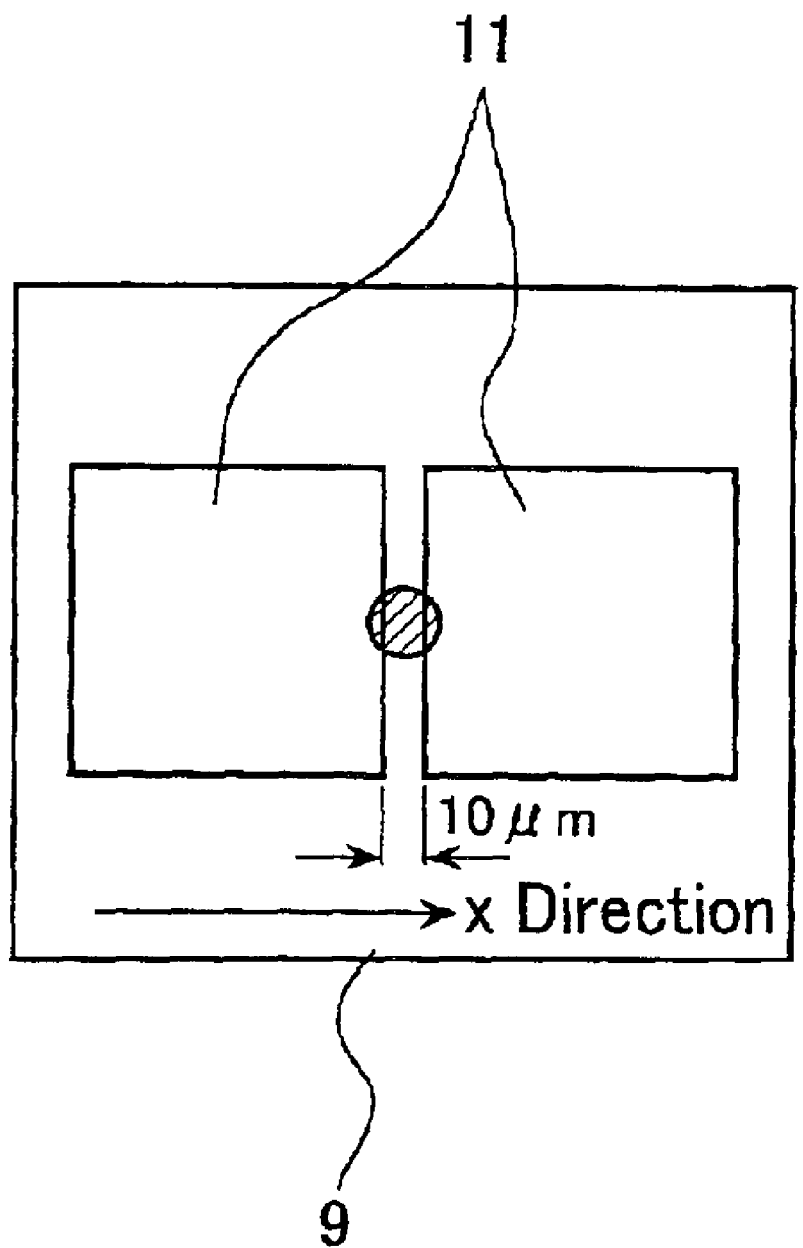
FIG. 2 is a schematic diagram showing the configuration of a light-receiving portion of a coherent light source according to a first embodiment of the present invention.

This embodiment uses a Si-PIN photodiode as the photo-detector 9. The photo-detector 9 includes two light-receiving portions 11 that are separated as shown in FIG. 2. The size of each of the light-receiving portions 11 is 50 μm×50 μm, and a space between them is 10 μm. The spot on the photo-detector 9 has a diameter of 20 μm. As shown in FIG. 2, the photo-detector 9 is adjusted so that light is focused on the center of the region between the light-receiving portions 11 when the fundamental light has a wavelength of 820 nm.

Figure 3:
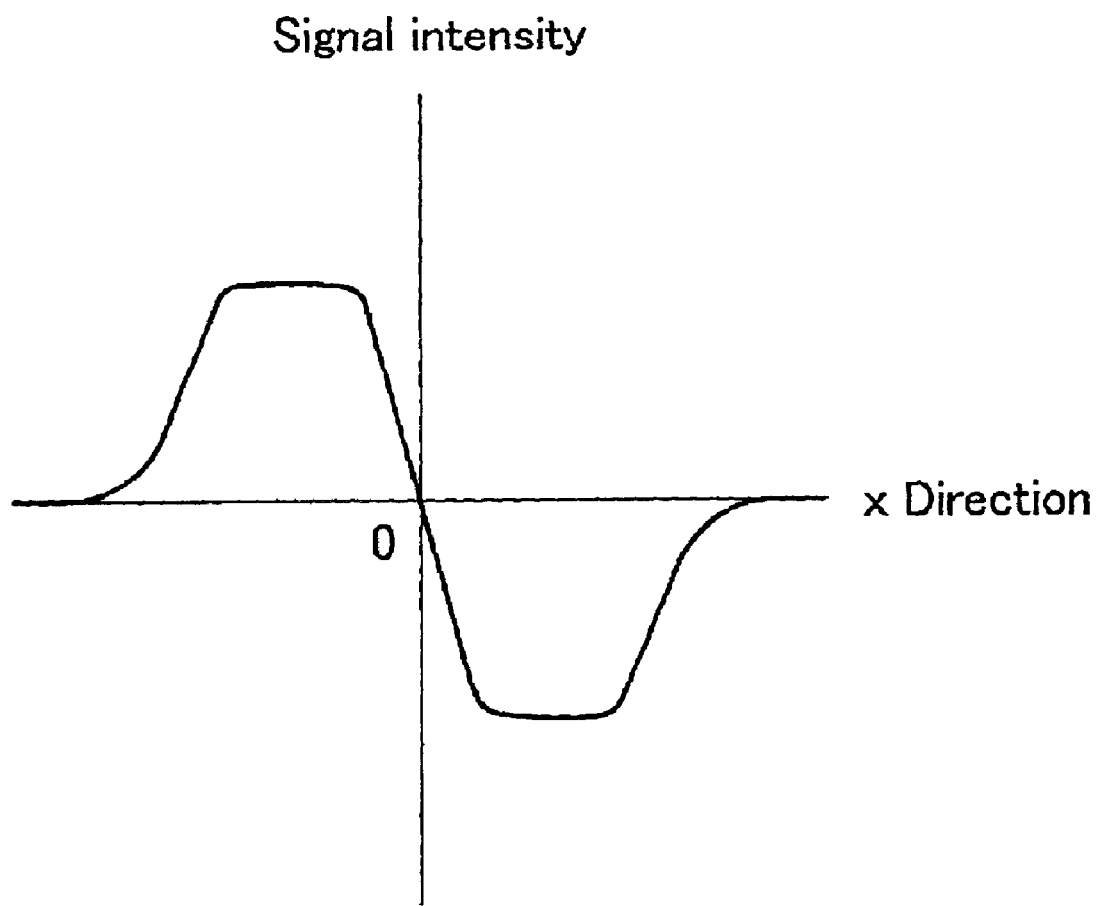
FIG. 3 is a signal waveform diagram detected by the light-receiving portion of a coherent light source according to a first embodiment of the present invention.

By determining a difference in outputs from the two light-receiving portions 11, a signal is obtained that corresponds to a wavelength variation of the fundamental light, as shown in FIG. 3. The wavelength of the fundamental light can be stabilized to 820 nm±0.02 nm in the following manner: the oscillation wavelength of the semiconductor laser (i.e., the wavelength-variable DBR semiconductor laser) 1 acting as a fundamental light source is controlled, i.e., the current to be input to the DBR region 1b and the phase control region 1c is controlled at a constant ratio, so that the signal obtained by the differentiation becomes zero. In such a case, the oscillation wavelength of the semiconductor laser 1 can be fixed to a desired wavelength within the phase-matching wavelength tolerance of the wavelength converting device (i.e., the QPM-SHG device 2). Thus, the wavelength of the harmonic light also is stabilized to fall in the range of 410 nm±0.01 nm.

In a holographic memory, since the Bragg grating has angular selectivity and wavelength selectivity, the wavelength of a light source during recording and reproducing has to be controlled. For the hologram medium having a thickness of 1 mm, the wavelength selectivity of the grating is 0.24 nm. This embodiment provides the harmonic light with a wavelength stability of 410±0.01 nm, which is sufficient to satisfy the required wavelength selectivity. Thus, favorable reproducing characteristics can be achieved.

In this embodiment, the module temperature, i.e., the temperature of the semiconductor laser 1 and the QPM-SHG device 2, is stabilized by the Peltier element. Therefore, the phase-matching wavelength is hardly varied and blue light is output stably.

This embodiment uses the harmonic light (i.e., the second harmonic light), which is generated by wavelength conversion with the wavelength converting device, as light for recording/reproducing on the hologram medium. In the wavelength conversion utilizing the second harmonic generation (SHG), the conversion efficiency is about 20%. Therefore, most of fundamental light is emitted from the optical waveguide 4 without being converted. The reason why this embodiment uses the fundamental light to detect the wavelength is that there are the following advantages:
(1) The fundamental light always can be monitored.
(2) The photo-detector 9 is more sensitive to the fundamental light than to the harmonic light.
(3) The unwanted light resulting from wavelength conversion can be used.
(4) The output of the fundamental light is larger than that of the harmonic light.
(5) The fundamental light has a longer wavelength, so that the angle of diffraction is large.

For an SHG blue light source, when the wavelength of the fundamental light deviates from the phase-matching wavelength of the QPM-SHG device 2, the output of the harmonic light is reduced. Therefore, the harmonic light cannot be detected in the case of such deviation. Accordingly, when wavelength control is performed by detecting the harmonic light, detection of the wavelength may be impossible. On the other hand, since the fundamental light always is emitted from the optical waveguide 4, stable wavelength control can be achieved by using the fundamental light. The quantum efficiency of the photo-detector 9, such as a Si-PIN photodiode, decreases as the wavelength of incident light becomes shorter, which in turn reduces the light receiving sensitivity. Moreover, the quantity of harmonic light generated by wavelength conversion is smaller than that of the fundamental light, and the harmonic light is used for recording/reproducing on the hologram medium. Therefore, it is desirable that the intensity of light for wavelength detection be as small as possible. As described above, when the fundamental light is used to control the wavelength, the signal having a sufficient intensity detectable with the photo-detector 9 can be obtained, resulting in stable wavelength control. Based on Equation 1, the fundamental light has a longer wavelength than that of the harmonic light, so that it can have a larger angle of diffraction with respect to the diffraction grating with the same grating pitch.

The practical effect of using the fundamental light to detect the wavelength is great because it can stabilize wavelength control and improve the efficiency of utilization of the harmonic light, that is, it allows most of the harmonic light generated by wavelength conversion to be used for recording/reproducing on the hologram medium.

This embodiment employs the photo-detector 9 divided into two portions as a means for detecting the position of diffracted light (i.e., the fundamental light). The same effect can be obtained even when the photo-detector is an array-type position detecting means.

Second Embodiment

In the first embodiment, the wavelength of the harmonic light is controlled in the following manner: the fundamental light and the harmonic light emitted from the optical waveguide 4 are separated with the wavelength separating function 7; only the fundamental light is directed to the reflecting diffraction grating 8 and its primary diffracted light is focused on the photo-detector 9. This embodiment allows a diffraction grating to be formed on an optical waveguide in a wavelength converting device and uses the diffracted light to control the wavelength of harmonic light. The configuration will be described below.

Figure 4:
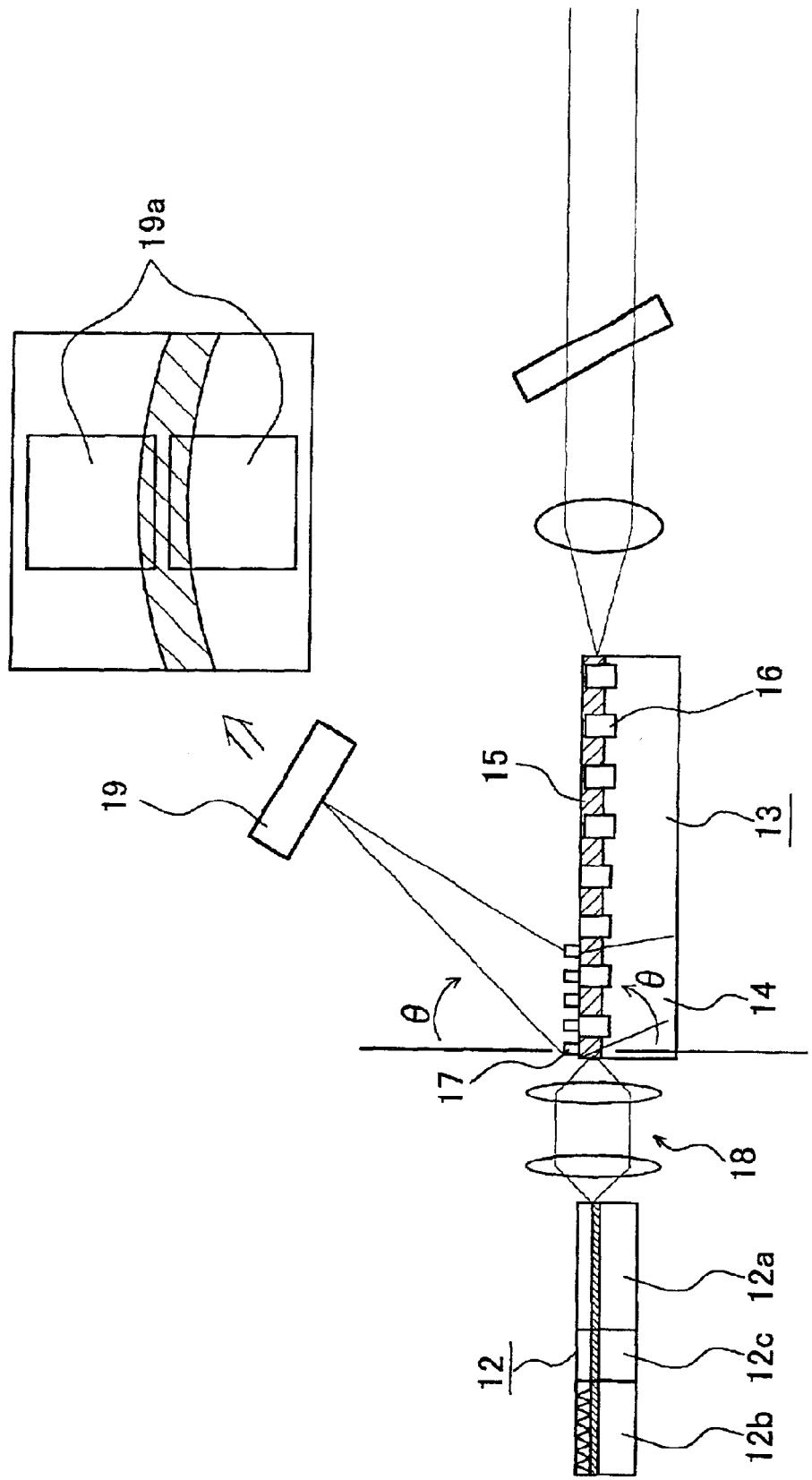
FIG. 4 is a schematic diagram showing the configuration of a coherent light source according to a second embodiment of the present invention.

FIG. 4 is a schematic diagram showing the configuration of a coherent light source according to a second embodiment of the present invention.

As shown in FIG. 4, like the first embodiment, a semiconductor laser 12 used as a fundamental light source is an AlGaAs wavelength-variable DBR semiconductor laser having an output power of 100 mW and a wavelength of 820 nm. The semiconductor laser 12 includes an active region 12a, a DBR region 12b, and a phase control region 12c. The wavelength of fundamental light can be varied by the input of current to the DBR region 12b and the phase control region 12c at a constant ratio. It is desired that the configuration of this embodiment should be designed so that only the fundamental light is separated as diffracted light and the efficiency of diffraction of the harmonic light is as small as possible.

An optical waveguide-type QPM-SHG device 13 is used as a wavelength converting device. The QPM-SHG device 13 includes an X-cut MgO-doped $LiNbO_3$ substrate 14, an optical waveguide 15, and a periodic polarization inversion region 16 perpendicular to the optical waveguide 15. The optical waveguide 15 and the periodic polarization inversion region 16 are formed on the substrate 14. In FIG. 4, reference numeral 18 is a coupling lens for coupling the fundamental light emitted from the semiconductor laser 12 to the optical waveguide 15.

The fundamental light has a wavelength of 820 nm and the harmonic light generated by wavelength conversion has a wavelength of 410 nm. The effective refractive index n of the optical waveguide 15 formed on the substrate 14 is about 2.2.

A diffraction grating 17 is formed on the optical waveguide 15 of the QPM-SHG device 13. The angle of diffraction θ with respect to light having a wavelength λ on the side of the air is defined by $$d \cdot (n - \sin\theta) = \lambda, \quad \text{Eq. 3}$$

while the angle of diffraction θ on the side of the substrate is defined by $$nd \cdot (1 - \sin\theta) = \lambda. \quad \text{Eq. 4}$$

When the diffraction grating 17 is designed so that light is diffracted in the 45° direction of the air side, it has a pitch (period) d of 549 nm. In this case, the fundamental light (primary) is diffracted in the 19° direction of the substrate side and the harmonic light (primary) is diffracted in the 41° direction of the substrate side.

As shown in FIG. 4, the fundamental light diffracted in the 45° direction of the air side by the diffraction grating 17 is focused on a photo-detector 19 as an arc-shaped emitted beam. The distance between the diffraction grating 17 and the photo-detector 19 is set to 20 mm. The amount of change in spot position on the photo-detector 19 for a wavelength variation of 820 nm±0.04 nm is given by δx=±20 mm×0.0001, resulting in ±2 μm.

This embodiment also uses a Si-PIN photodiode as the photo-detector 19. The photo-detector 19 includes two light-receiving portions 19a that are separated and is adjusted so that light is focused on the center of the region between the light-receiving portions 19a when the fundamental light has a wavelength of 820 nm.

By determining a difference in outputs from the two light-receiving portions 19a, an S-shaped signal is obtained that corresponds to a wavelength variation of the fundamental light. The wavelength of the fundamental light can be stabilized to 820 nm±0.02 nm in the following manner: the oscillation wavelength of the semiconductor laser (i.e., the wavelength-variable DBR semiconductor laser) 12 acting as a fundamental light source is controlled, i.e., the current to be input to the DBR region 12b and the phase control region 12c is controlled at a constant ratio, so that the signal obtained by the differentiation becomes zero. In such a case, the oscillation wavelength can be fixed to a desired wavelength within the phase-matching wavelength tolerance of the wavelength converting device (i.e., the QPM-SHG device 13). Thus, the wavelength of the harmonic light also is stabilized to fall in the range of 410 nm±0.01 nm.

A method for producing the QPM-SHG device 13 as the wavelength converting device of this embodiment will be described below. First, a resist is applied to the substrate 14 on which the optical waveguide 15 and the periodic polarization inversion region 16 are formed. The diffraction grating (grating) 17 is formed as a chirped grating so that the diffracted light can be focused. A mask used in producing the grating is designed so that the period at the incident end of the optical waveguide 15 is greater than 549 nm, while the period at the outgoing end is smaller than 549 nm. This makes it possible to focus the arc-shaped emitted beam on the photo-detector 19 that is located 20 mm away from the grating. Then, a SiO$_2$ film is formed on the resist-coated grating by sputtering, and the resist is removed by wet etching. Consequently, the SiO$_2$ diffraction grating is formed on the optical waveguide 15 with a lift-off process.

The grating has a length of 2 mm. The arc-shaped emitted beam on the photo-detector 19 has a width of about 10 μm. The grating is designed so as to have a shallow depth and diffracts the fundamental light with 5% efficiency. At this time, the efficiency of diffraction of the harmonic light also is 5% or less.

In this embodiment, the module temperature, i.e., the temperature of the semiconductor laser 12 and the QPM-SHG device 13, is stabilized by a Peltier element. Therefore, the phase-matching wavelength is hardly varied and blue light is output stably.

Figure 5:
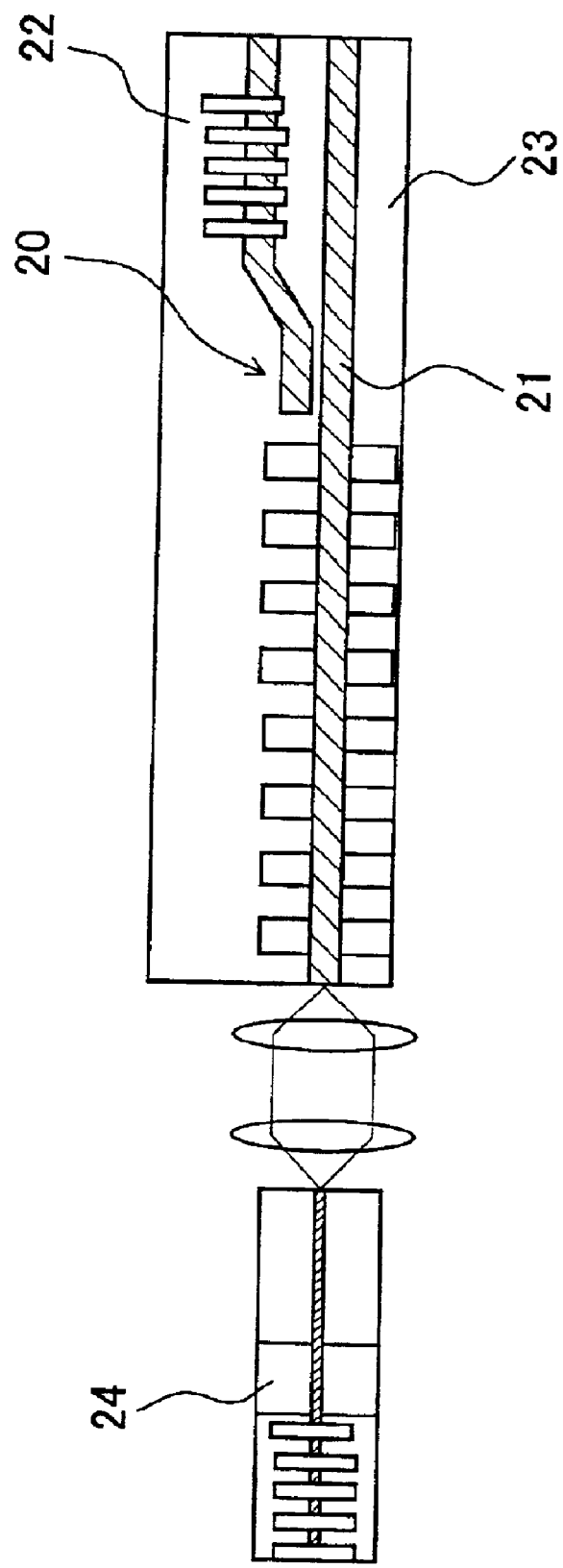
FIG. 5 is a schematic diagram showing another configuration of a coherent light source according to a second embodiment of the present invention.

The configuration shown in FIG. 5 includes a directional coupler 20 for coupling only fundamental light to one of the adjacent optical waveguides 21 that is provided with a diffraction grating 22. In the configuration shown in FIG. 4, the diffraction grating 17 formed on the optical waveguide 15 has a diffraction efficiency of 5% or less for the harmonic light. However, such a configuration reduces the efficiency of utilization of the harmonic light generated by wavelength conversion. This embodiment includes the directional coupler 20, with which the harmonic light loss is decreased and the fundamental light that has traveled without being converted is separated and used for stabilizing the wavelength. Thus, the efficiency of utilization of the harmonic light can be improved significantly.

As shown in FIG. 5, the directional coupler 20 is provided in the outgoing portion of an optical waveguide-type QPM-SHG device 23, and the diffraction grating 22 similar to that in FIG. 4 is formed on the optical waveguide 21. The directional coupler 20 is designed so that the waveguides are spaced 3 μm apart and a coupling length is 0.5 mm. In the wavelength converting device including the optical waveguide produced by proton exchange, the mode of the fundamental light is greater than that of the harmonic light. For this reason, the exudation of mode is significant. When the space between the waveguides is 3 μm, the coupling coefficient of the harmonic light is almost zero, and only the fundamental light is coupled to one of the adjacent optical waveguides 21. In such a case, the coupling coefficient of the fundamental light is about 10% and the harmonic light loss is 0.5%.

The fundamental light coupled to one of the adjacent optical waveguides 21 is diffracted in the direction of a photo-detector by the diffraction grating 22, and thus the wavelength of the fundamental light is detected in the same manner as that shown in FIG. 4. Accordingly, the oscillation wavelength of a semiconductor laser (i.e., a wavelength-variable DBR semiconductor laser) 24 acting as a fundamental light source is controlled to be fixed to a desired wavelength within the phase-matching wavelength tolerance of the wavelength converting device (i.e., the QPM-SHG device 23). This can provide blue light having a stable wavelength.

In a holographic memory, since the Bragg grating has angular selectivity and wavelength selectivity, the wavelength of a light source during recording and reproducing has to be controlled. For the hologram medium having a thickness of 1 mm, the wavelength selectivity of the grating is 0.24 nm. This embodiment provides the harmonic light with a wavelength stability of 410±0.01 nm, which is sufficient to satisfy the required wavelength selectivity. Thus, favorable reproducing characteristics can be achieved.

Figure 6:
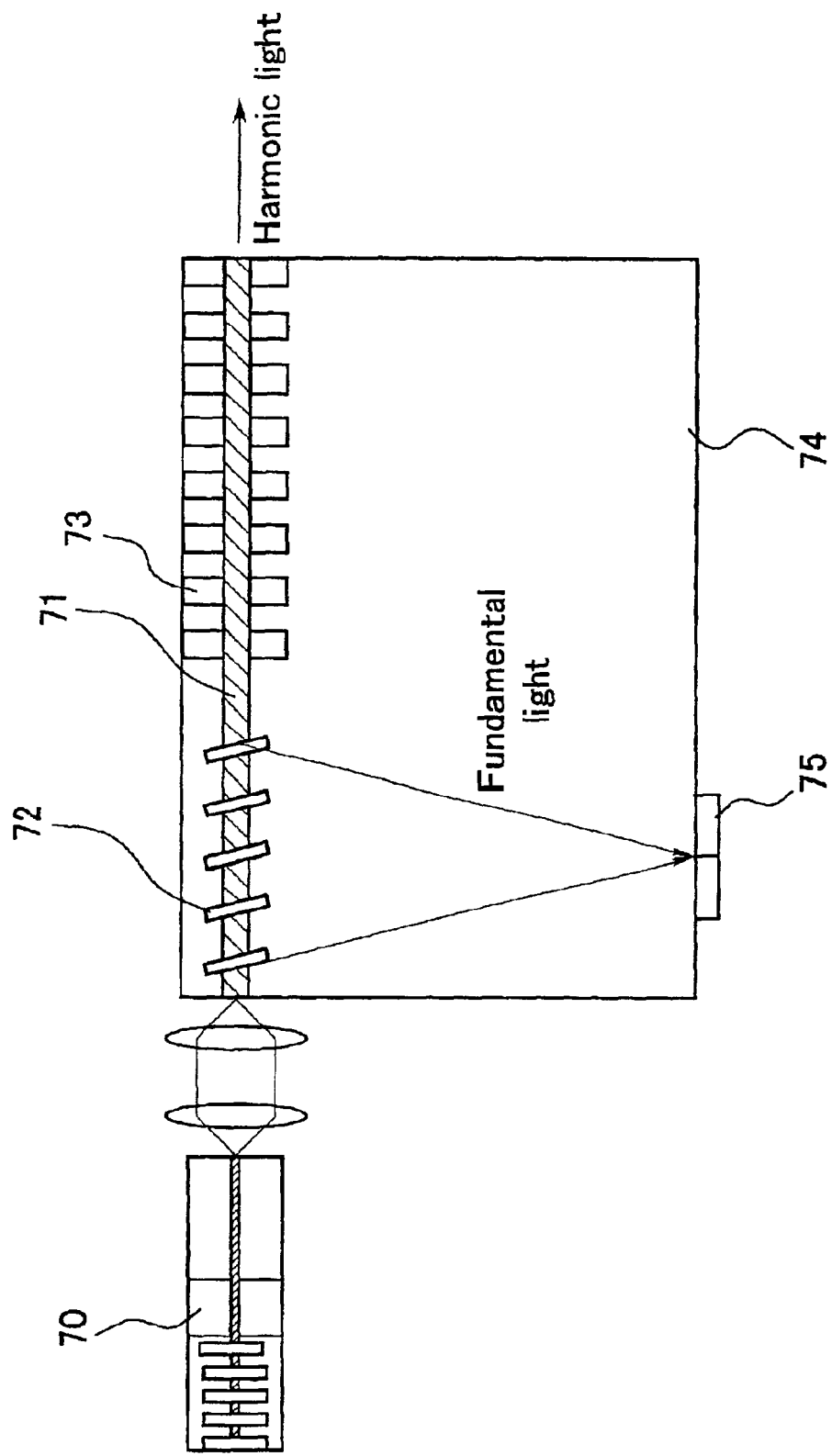
FIG. 6 is a schematic diagram showing yet another configuration of a coherent light source according to a second embodiment of the present invention.

The configuration shown in FIG. 6 includes a photo-detector 75 provided on one side of an optical waveguide-type QPM-SHG device 74 that is used as a wavelength converting device. The fundamental light diffracted by a diffraction grating 72 is detected with the photo-detector 75 so that the wavelength of harmonic light is controlled. In FIG. 6, reference numeral 73 indicates a periodic polarization inversion region.

The fundamental light has a wavelength of 820 nm and the harmonic light generated by wavelength conversion has a wavelength of 410 nm. The effective refractive index n of an optical waveguide 71 formed on an X-cut MgO-doped LiNbO$_3$ substrate is about 2.2. Based on Equation 4, when the diffraction grating 72 has a pitch (period) d of 373 nm, the angle of diffraction θ is zero, i.e., the angle of diffraction of the fundamental light with respect to its traveling direction is 90°. Therefore, the fundamental light is focused on the photo-detector 75 that is located at a right angle to the diffraction grating 72. The diffraction grating 72 is a chirped grating, which is similar to that formed on the QPM-SHG device 13, and is produced in the same manner as that for the diffraction grating formed on the QPM-SHG device 13.

The grating has a length of 2 mm. The belt-shaped emitted beam on the photo-detector 75 has a width of about 10 μm. The grating is designed so as to have a shallow depth and diffracts the fundamental light with 5% efficiency. At this time, the efficiency of diffraction of the harmonic light also is 5% or less. The distance between the diffraction grating 72 and the photo-detector 75 is set to 10 mm.

This configuration also uses a Si-PIN photodiode as the photo-detector 75 including two light-receiving portions that are separated. The photo-detector 75 is adjusted so that light is focused on the center of the region between the light-receiving portions when the fundamental light has a wavelength of 820 nm.

By determining a difference in outputs from the two light-receiving portions, an S-shaped signal is obtained that corresponds to a wavelength variation of the fundamental light. The oscillation wavelength of the fundamental light can be stabilized in the following manner: the oscillation wavelength of a semiconductor laser (i.e., a wavelength-variable DBR semiconductor laser) 70 acting as a fundamental light source is controlled so that the signal obtained by the differentiation becomes zero. Consequently, the oscillation wavelength can be fixed to a desired wavelength within the phase-matching wavelength tolerance of the wavelength converting device (i.e., the QPM-SHG device 74). Thus, the wavelength of the harmonic light also is stabilized.

This embodiment allows the diffraction grating to be formed on the optical waveguide in the wavelength converting device, which eliminates the need for components such as a reflecting diffraction grating and a wavelength separating function. Therefore, a small wavelength stabilization mechanism can be achieved at low cost.

In this embodiment, the practical effect of using the fundamental light, which is emitted from the optical waveguide without being converted, to detect the wavelength is great because the efficiency of utilization of the harmonic light can be improved significantly.

Third Embodiment

In the first embodiment, the wavelength of the harmonic light is controlled in the following manner: the fundamental light and the harmonic light emitted from the optical waveguide 4 are separated with the wavelength separating function 7; only the fundamental light is directed to the reflecting diffraction grating 8 and its primary diffracted light is focused on the photo-detector 9. This embodiment controls the wavelength of harmonic light by using a Cs absorption line to control the wavelength of fundamental light at 852 nm. The configuration will be described below.

Figure 7:
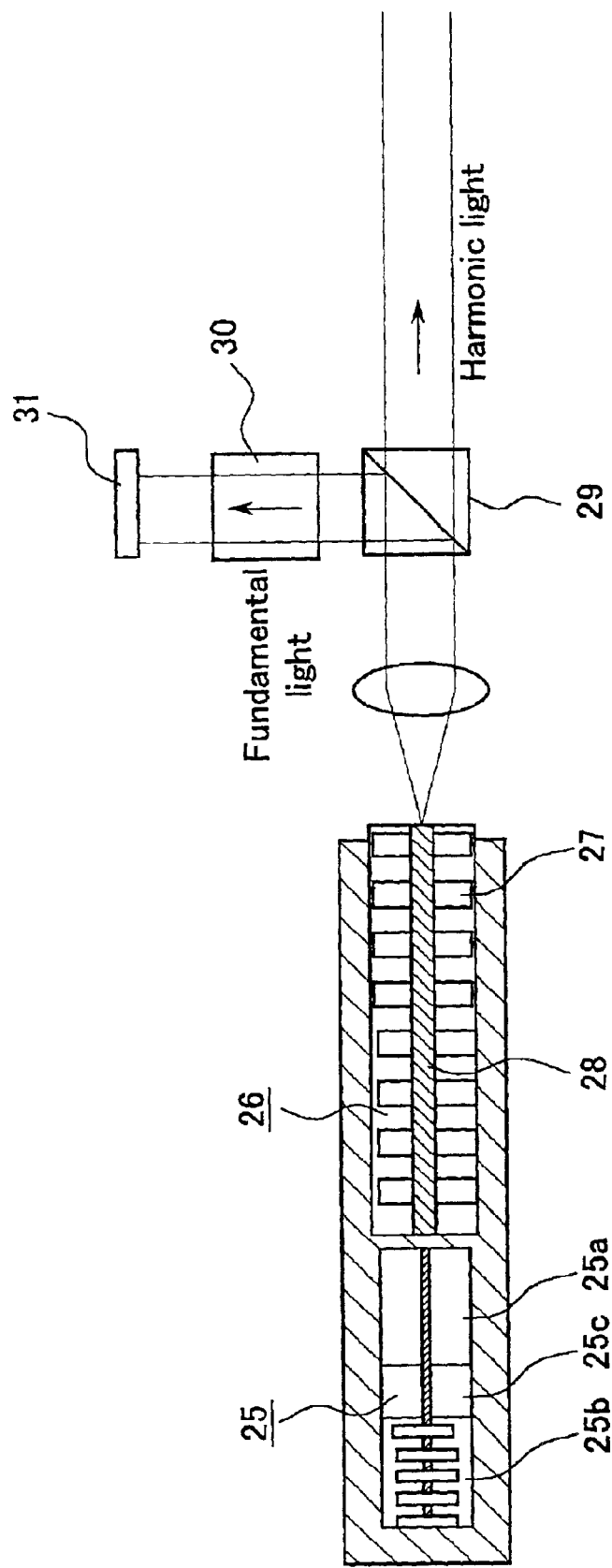
FIG. 7 is a schematic diagram showing the configuration of a coherent light source according to a third embodiment of the present invention.

FIG. 7 is a schematic diagram showing the configuration of a coherent light source according to a third embodiment of the present invention.

As shown in FIG. 7, like the first embodiment, a semiconductor laser 25 used as a fundamental light source is an AlGaAs wavelength-variable DBR semiconductor laser having an output power of 100 mW and a wavelength of 850 nm. The semiconductor laser 25 includes an active region 25a, a DBR region 25b, and a phase control region 25c. The wavelength of the fundamental light can be varied by the input of current to the DBR region 25b and the phase control region 25c at a constant ratio.

In this embodiment, the period of a periodic polarization inversion region 27 of an optical waveguide-type QPM-SHG device 26 is designed so that a phase-matching wavelength is 852 nm. The fundamental light and the harmonic light emitted from an optical waveguide 28 of the QPM-SHG device 26 are separated with a wavelength separating function 29. The fundamental light thus separated is directed to a Cs gas cell 30 filled with a Cs gas, and the light passing through the Cs gas cell 30 is detected by a photo-detector 31. The Cs absorption line has a range of wavelength centered at 852 nm. The wavelength of the fundamental light is controlled so as to minimize the intensity of light passing through the Cs gas cell 30 that is detected by the photo-detector 31. This allows the wavelength of the fundamental light to be controlled to a phase-matching wavelength of 852 nm and the wavelength of the harmonic light to be stabilized at 426 nm.

In this embodiment, the module temperature, i.e., the temperature of the semiconductor laser 25 and the QPM-SHG device 26, is stabilized by a Peltier element. Therefore, the phase-matching wavelength is hardly varied and blue light is output stably.

An absolute wavelength of light in the grating or the diffraction grating on the optical waveguide is varied subtly due to changes with temperature and time. However, the use of the absorption line of a material, such as the Cs gas cell 30 in this embodiment, can stabilize the absolute value of wavelength and achieve wavelength control with higher accuracy.

In this embodiment, the practical effect of using the fundamental light, which is emitted from the optical waveguide without being converted, to detect the wavelength is great because the efficiency of utilization of the harmonic light can be improved significantly.

Fourth Embodiment

In the first, second and third embodiments, the wavelength of harmonic light is stabilized by controlling the wavelength of fundamental light within the phase-matching wavelength tolerance (about 0.1 nm) of the wavelength converting device. However, the amount of variation in optimum wavelength over the range of temperature change of a hologram medium of 25° C. is 0.18%, calculated using a linear expansion coefficient. This is 515 nm+0.9 nm in terms of the oscillation wavelength of an Ar laser. The hologram medium is OmniDex 352, i.e., a photopolymer manufactured by Dupont.

This embodiment will describe a coherent light source whose wavelength is controlled optimally according to a change in temperature of the hologram medium during reproducing to achieve stable hologram reproduction over the range of temperature change.

Figure 8:
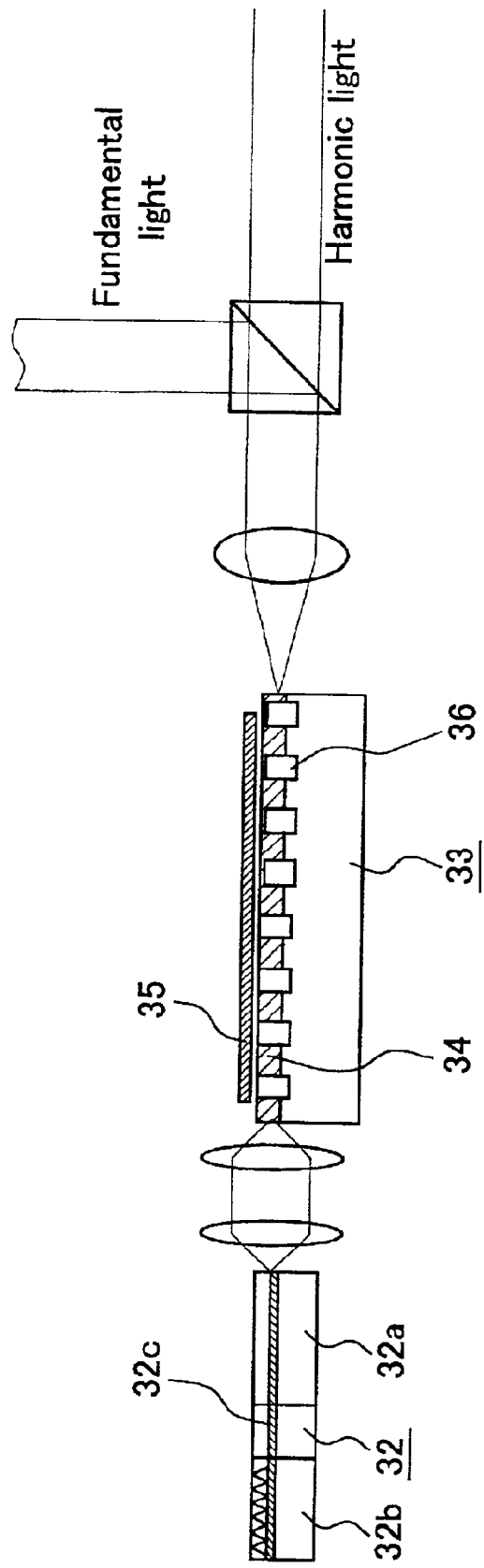
FIG. 8 is a schematic diagram showing the configuration of a coherent light source according to a fourth embodiment of the present invention.

FIG. 8 is a schematic diagram showing the configuration of a coherent light source according to a fourth embodiment of the present invention.

As shown in FIG. 8, like the first embodiment, a semiconductor laser 32 used as a fundamental light source is an AlGaAs wavelength-variable DBR semiconductor laser having an output power of 100 mW and a wavelength of 820 nm. The semiconductor laser 32 includes an active region 32a, a DBR region 32b, and a phase control region 32c. The wavelength of fundamental light can be varied by the input of current to the DBR region 32b and the phase control region 32c at a constant ratio.

Like the first embodiment, an optical waveguide-type QPM-SHG device 33 is used as a wavelength converting device. Unlike the first embodiment, this embodiment includes a heater 35 formed on an optical waveguide 34. The refractive index of an X-cut MgO-doped LiNbO₃ substrate has temperature dependency. Therefore, the effective period of a polarization inversion region 36 changes with a change in temperature of the wavelength converting device. The effective refractive index of the optical waveguide 34 changes as well. Consequently, the phase-matching wavelength has temperature dependency.

The QPM-SHG device 33 of this embodiment has a temperature dependency of 0.06 nm/° C. An increase in current to be input to the heater 35 raises the temperature of the optical waveguide 34 portion and causes the phase-matching wavelength to shift to the long-wavelength side. Specifically, the input of current to the heater 35 increases the temperature of the optical waveguide 34 portion by 30° C. and shifts the phase-matching wavelength by about 1.8 nm.

When the laser output is 100 mW, a laser beam of 60 mW is coupled to the optical waveguide 34. The oscillation wavelength is fixed to a phase-matching wavelength of the QPM-SHG device (i.e., the wavelength converting device) 33 of 820 nm by controlling the amount of current to be input to the DBR region 32b and the phase control region 32c of the semiconductor laser (i.e., the wavelength-variable DBR semiconductor laser) 32. This coherent light source provides blue light of about 10 mW having a wavelength of 410 nm. The wavelength tolerance for phase matching is 0.1 nm, given by a full-width at half-maximum of the output of the blue light.

The wavelength of the semiconductor laser (i.e., the wavelength-variable DBR semiconductor laser) 32, including the DBR region 32b and the phase control region 32c, can be varied continuously in the range of about 2 nm. Therefore, the wavelength of the fundamental light can be varied from 820 nm to 821.8 nm by controlling the amount of current to be input to the heater 35 and that to be input to the DBR region 32b and the phase control region 32c, so that the wavelength of the harmonic light can be varied from 410 nm to 410.9 nm while maintaining a constant output of the harmonic light.

When an Ar laser (having an oscillation wavelength of 515 nm) is used as a light source, the wavelength of the coherent light source of this embodiment can be varied in the range of 0.9 nm, which is required for temperature changes of a hologram medium in the range of 25° C. Thus, stable reproducing characteristics according to a change in temperature of the hologram medium always can be obtained.

Figure 9:
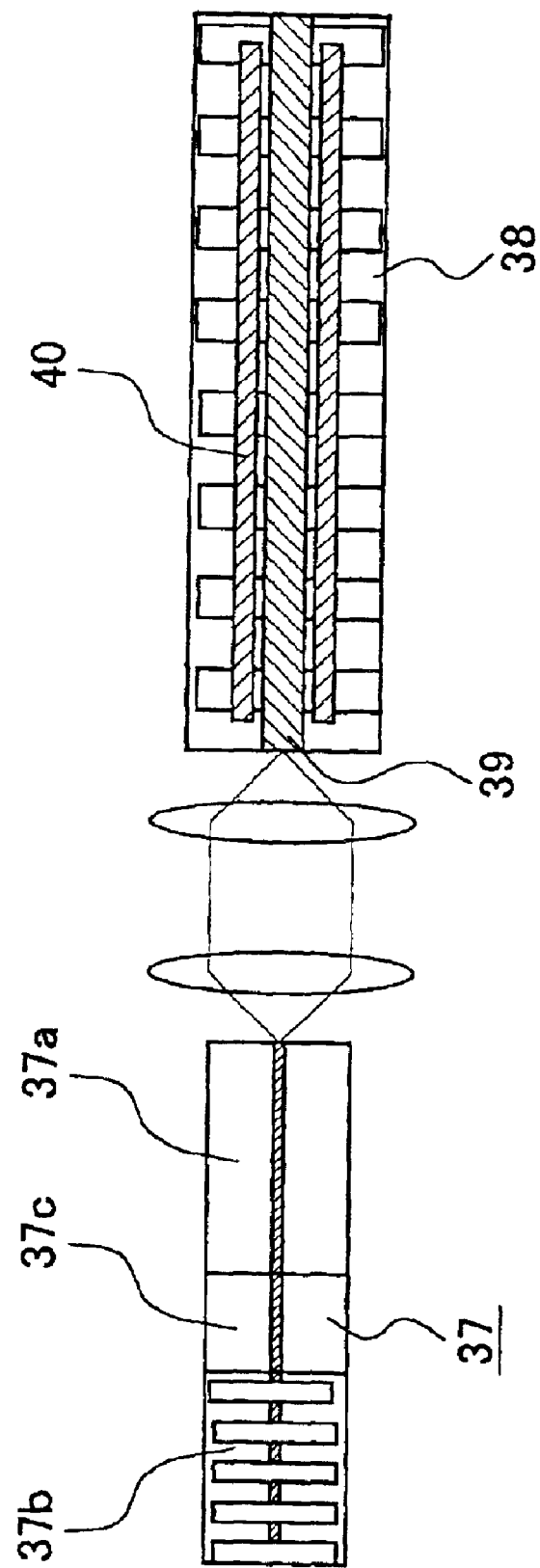
FIG. 9 is a schematic diagram showing another configuration of a coherent light source according to a fourth embodiment of the present invention.

FIG. 9 is a schematic diagram showing another configuration of a coherent light source according to the fourth embodiment of the present invention.

As shown in FIG. 9, like the configuration in FIG. 8, a semiconductor laser 37 used as a fundamental light source is an AlGaAs wavelength-variable DBR semiconductor laser having an output power of 100 mW and a wavelength of 820 nm. The semiconductor laser 37 includes an active region 37a, a DBR region 37b, and a phase control region 37c. The wavelength of fundamental light can be varied by the input of current to the DBR region 37b and the phase control region 37c at a constant ratio.

Like the configuration in FIG. 8, an optical waveguide-type QPM-SHG device 38 is used as a wavelength converting device. Unlike the configuration in FIG. 8, this configuration includes parallel electrodes 40 formed on both sides of an optical waveguide 39. An X-cut MgO-doped LiNbO₃ substrate has an electrooptic effect and its refractive index is changed by application of an electric field. Therefore, when a voltage is applied across the parallel electrodes 40, the refractive index of the optical waveguide 39 is changed. This causes a variation in phase-matching wavelength. The use of the QPM-SHG device 38 of this configuration allows the wavelength to be varied by 2 nm when a voltage of 5 V is applied.

When the laser output is 100 mW, a laser beam of 60 mW is coupled to the optical waveguide 39. The oscillation wavelength is fixed to a phase-matching wavelength of the QPM-SHG device (i.e., the wavelength converting device) 38 of 820 nm by controlling the amount of current to be input to the DBR region 37b and the phase control region 37c of the semiconductor laser (i.e., the wavelength-variable DBR semiconductor laser) 37. This coherent light source provides blue light of about 10 mW having a wavelength of 410 nm.

The wavelength of the semiconductor laser (i.e., the wavelength-variable DBR semiconductor laser) 37, including the DBR region 37b and the phase control region 37c, can be varied continuously in the range of about 2 nm. Therefore, the wavelength of the fundamental light can be varied from 820 nm to 822 nm by controlling the amount of current to be input to the parallel electrodes 40 and that to be input to the DBR region 37b and the phase control region 37c, so that the wavelength of the harmonic light can be varied from 410 nm to 411 nm while maintaining a constant output of the harmonic light.

When an Ar laser (having an oscillation wavelength of 515 nm) is used as a light source, the wavelength of the coherent light source of this embodiment can be varied in the range of 0.9 nm, which is required for temperature changes of a hologram medium in the range of 25° C. Thus, stable reproducing characteristics according to a change in temperature of the hologram medium always can be obtained.

In the configurations shown in FIGS. 8 and 9, the wavelength of a reference beam for the hologram medium has to be adjusted to an optimum value that meets the Bragg conditions of the hologram medium. To achieve this, a wavelength detecting means using fundamental light is effective, as shown in the first, second and third embodiments. Moreover, the coherent light sources shown in FIGS. 8 and 9 allow their wavelengths to follow a change in temperature of the hologram medium, thereby providing stable reproducing characteristics. The first and second embodiments employ the photo-detector divided into two portions, while this embodiment employs an array-type photo-detector for detecting an absolute value of wavelength.

Figure 10:
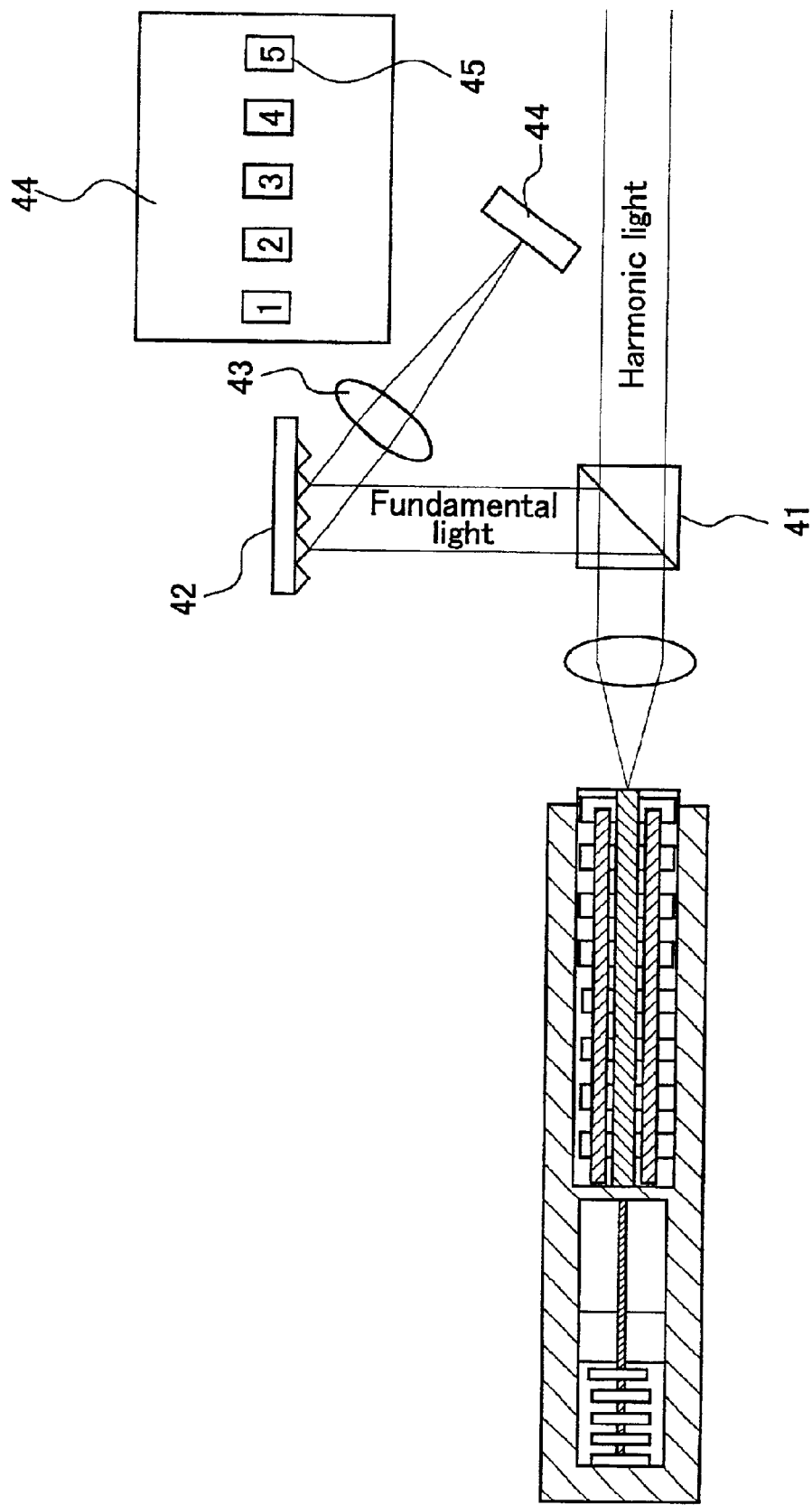
FIG. 10 is a schematic diagram showing the configuration of a wavelength detecting system according to a fourth embodiment of the present invention.

FIG. 10 shows the configuration of a wavelength detecting system including an array-type photo-detector and a reflecting diffraction grating. As shown in FIG. 10, the fundamental light and the harmonic light emitted from an optical waveguide are separated with a wavelength separating function 41. The fundamental light thus separated is directed to a reflecting diffraction grating 42, and its primary diffracted light is focused on a photo-detector 44 through a condenser lens 43. A diffraction grating having a pitch d of 1000 groove/mm (=1/d) is used as the reflecting diffraction grating 42. A condenser lens having a focal distance f of 20 mm is used as the condenser lens 43. The amount of change in spot position for a wavelength variation of 820 nm+0.4 nm is given by δx=20 mm×0.0007, resulting in 14 μm.

A Si-PIN photodiode is used as the photo-detector 44. The photo-detector 44 includes an array of five light-receiving portions 45 that are separated. The size of each of the light-receiving portions 45 is 9 μm×9 μm, and a space between them is 5 μm. The photo-detector 44 is adjusted so that each of the light-receiving portions 45 (represented by 1 to 5 in FIG. 10) exhibits maximum light detectivity when the fundamental light has a wavelength of 820 nm (i.e., the wavelength of the harmonic light is 410 nm). Therefore, when the light-receiving portion 45 represented by 2 has its maximum light detectivity, the wavelength of the fundamental light can be controlled to 820.4 nm (i.e., the wavelength of the harmonic light is 410.2 nm). When the light-receiving portion 45 represented by 5 has its maximum light detectivity, the wavelength of the fundamental light can be controlled to 822 nm (i.e., the wavelength of the harmonic light is 411 nm). In other words, the wavelength of the harmonic light can be varied discontinuously from 410 nm to 411 nm with each increase of 0.2 nm.

When an Ar laser (having an oscillation wavelength of 515 nm) is used as a light source, the wavelength-variable range of the light source is 0.9 nm, which is required for temperature changes of a hologram medium in the range of 25° C. The wavelength of the coherent light source of this embodiment can be varied, though discontinuously, in the range of 1 nm while detecting the wavelength. Thus, the coherent light source can select an optimum wavelength for reproduction according to a change in temperature of the hologram medium, thereby providing stable reproducing characteristics.

Figure 13:
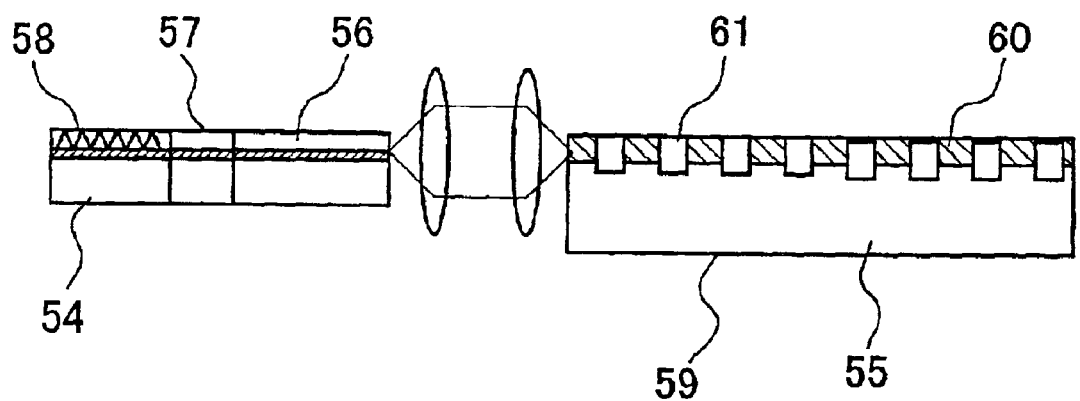
FIG. 13 shows the schematic configuration of a conventional SHG blue light source including an optical waveguide-type QPM-SHG device.

A more stable control system will be described with reference to FIG. 13 showing a conventional SHG blue light source including an optical waveguide-type QPM-SHG device.

As shown in FIG. 13, the SHG blue light source provides harmonic light by wavelength conversion of fundamental light that is coupled to the optical waveguide 60 in the optical waveguide-type QPM-SHG device 55. The output of the harmonic light thus obtained is proportional to the square of the output of the fundamental light. Therefore, to achieve a constant output of the harmonic light, it is necessary to keep the output of the fundamental light coupled to the optical waveguide 60 constant. In the SHG blue light source, however, the state of optical coupling changes depending on distortion or the like of the module, the module including the wavelength-variable DBR semiconductor laser 54 and the QPM-SHG device 55. This causes a change in output of the fundamental light coupled to the optical waveguide 60. Thus, to achieve a stable output of the harmonic light, it is also necessary to control the output of the semiconductor laser 54, which acts as the fundamental light. The following is an explanation of the control method.

Figure 11:
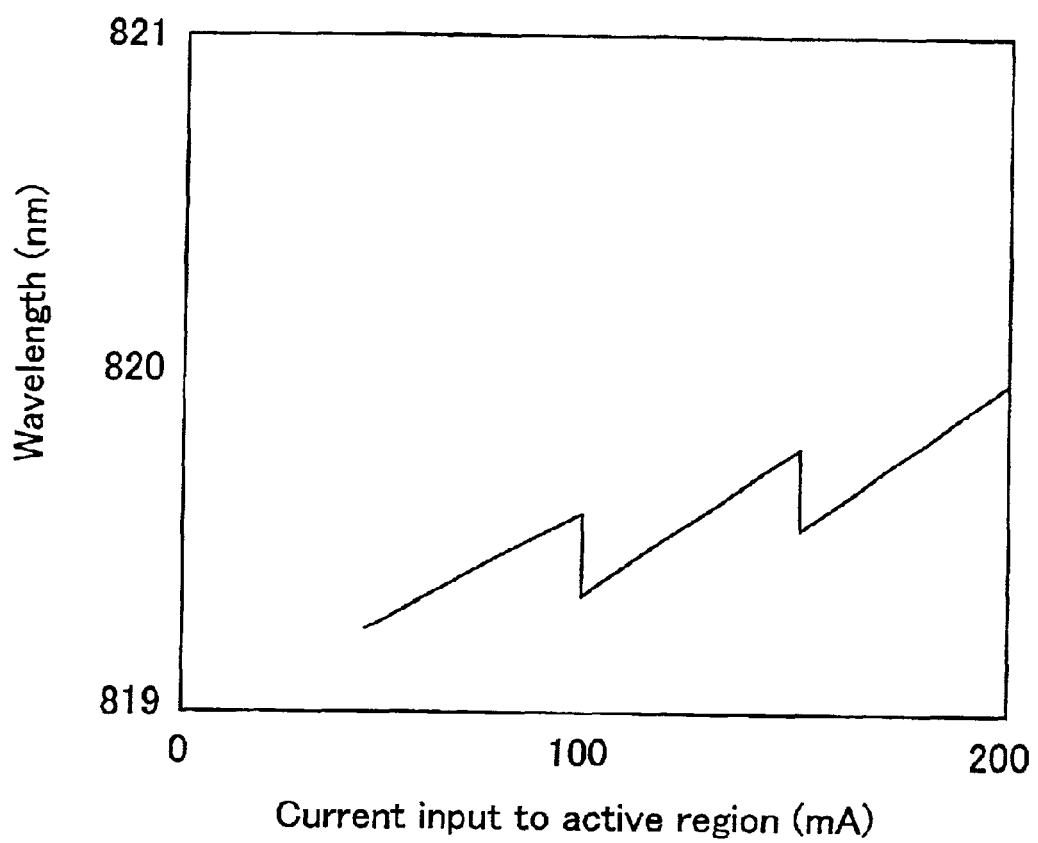
FIG. 11 shows the relationship between current input to an active region and the oscillation wavelength of a wavelength-variable DBR semiconductor laser according to a fourth embodiment of the present invention.
Figure 12:
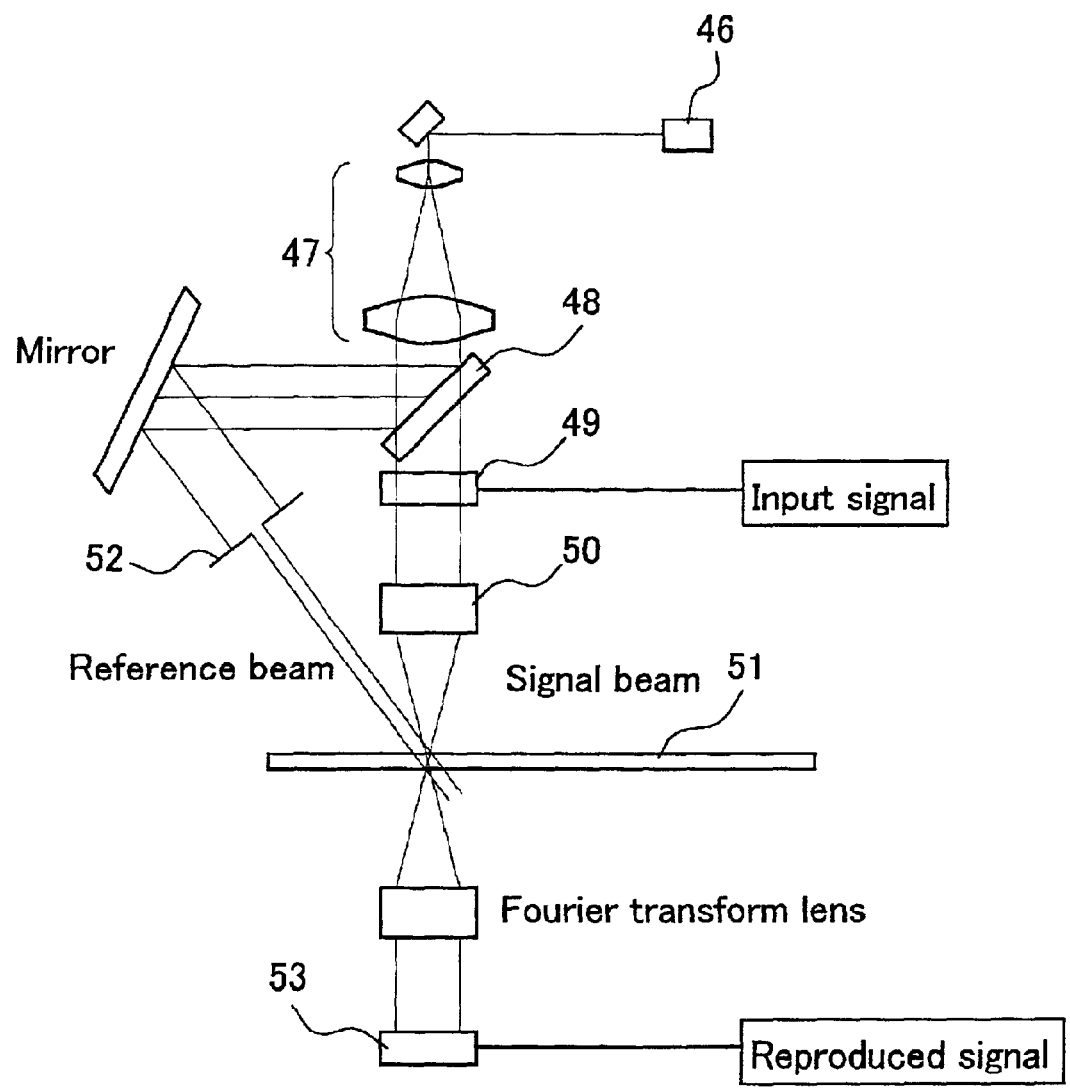
FIG. 12 shows the schematic configuration of a conventional holographic optical information recording/reproducing system.

FIG. 11 shows the relationship between the current input to the active region 56 (see FIG. 13) and the oscillation wavelength of the semiconductor laser 54. When current is input to the active region 56, the current that is not converted into light is converted into heat, thereby increasing the temperature of the semiconductor laser (i.e., a semiconductor laser chip) 54. This results in an increase in temperatures of the active region 56, the phase control region 57 (see FIG. 13), and the DBR region 58 (see FIG. 13). Such temperature rise leads to the following phenomena:

(a) With an increase in temperature of the active region 56, the refractive index of the active region 56 changes to cause a change in effective resonator length. Consequently, the phase of light is changed and the oscillation wavelength of the semiconductor laser 54 is varied.

(b) With heat conduction from the active region 56 to the DBR region 58, the refractive index of a diffraction grating of the DBR region 58 is increased. Consequently, the wavelength of light that is fed back to the active region 56 shifts to the long-wavelength side.

As shown in FIG. 11, the oscillation wavelength of the semiconductor laser 54 shifts to the long-wavelength side with an increase in the amount of current to be input to the active region 56. FIG. 11 makes it clear that intensity modulation of the semiconductor laser 54 allows the oscillation wavelength to shift by about 0.1 to 0.2 nm.

Thus, by compensating for temperature change (phase change) resulting from a change in output of the semiconductor laser 54, the oscillation wavelength can be kept constant even when the output of the semiconductor laser 54 changes.

Here, the amount of heat generated in the active region 56 when the output of the semiconductor laser 54 changes is compensated by the amount of heat generated in the phase control region 57.

The amount of heat generated in the active region 56 is expressed by $$I_1 \times V_1 - P \qquad \text{Eq. 5}$$

where $I_1$ is a current (mA) input to the active region 56, $V_1$ is an operating voltage of the active region 56, and P is a laser output.

The temperature of the semiconductor laser (i.e., the semiconductor laser chip) 54 can be kept constant in such a manner that the amount of heat of Equation 5 is compensated by that generated in the phase control region 57.

The amount of heat generated in the active region 56 can be compensated by that generated in the phase control region 57 in the following manner: when the current to be input to the active region 56 is increased according to a reduction in output of the fundamental light coupled to the optical waveguide 60 caused by a change in the state of optical coupling, the current to be input to the phase control region 57 is decreased; when the current into the active region 56 is decreased, that into the phase control region 57 is increased. Specifically, each factor is controlled so as to satisfy the relationship defined by $$I_1 \times V_1 + I_2 \times V_2 - P = \text{constant} \qquad \text{Eq. 6}$$

where $I_2$ is a current (mA) to be input to the phase control region 57 and $V_2$ is an operating voltage of the phase control region 57.

The oscillation wavelength of the semiconductor laser 54 can be kept constant by controlling each factor so as to satisfy the relationship of Equation 6.

As described above, the oscillation wavelength of the semiconductor layer 54 can be kept constant by performing the above control so that the differentiation of signals, which are detected with the photo-detector 9 in the configuration shown in FIG. 1, is zero. This can be achieved even when the output of the semiconductor laser 54 is controlled to maintain a constant output of the fundamental light coupled to the optical waveguide 60 and thus the output of the harmonic light obtained is stabilized. In this case, since the oscillation wavelength of the semiconductor laser 54 can be controlled easily, the wavelength and output of the harmonic light can be controlled quickly.

In this embodiment, a variation in oscillation wavelength of the semiconductor laser 54 is compensated by changing the current to be input to the phase control region 57. However, the same effect can be obtained by changing the current to be input to the DBR region 58.

This embodiment refers to hologram recording that employs a coherent light source having an optimally controlled wavelength. In other words, this embodiment controls the wavelength of the fundamental light so as to control the wavelength of the harmonic light that is directed to a hologram medium. Therefore, even if the temperature of the hologram medium changes, it is possible to select an optimum wavelength for reproduction and to provide stable reproducing characteristics. The wavelength control system using fundamental light in an SHG blue light source can be utilized in applications other than hologram recording. When the SHG blue light source is used in recording and reproducing an optical disk, the use of a plastic lens or the like gives rise to a problem of chromatic aberration. Also, the recording sensitivity of a recording medium (such as a phase-change optical disk and a magnet-optical disk) differs depending on wavelength. In these cases, more stable recording and reproducing can be achieved by controlling wavelength of the light source as described in this embodiment.

The invention may be embodied in other forms without departing from the spirit or essential characteristics thereof The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A coherent light source comprising:
    a source emitting a first light having a first wavelength; and
    a wavelength converting device for receiving the first light and converting the wavelength of a part of the first light by half by second-harmonic generation due to non-linearity of the wavelenght converting device,
    the wavelength converting device converting the part of the first light into a second light having a second wavelength,
    a light separator that separates the first light and the second light, and
    a detector that detects the wavelength of the first light separated by the light separation mechanism and a controller that controls the first light to a desired wavelength,
    wherein the wavelength of the first light is detected and controlled to the desired wavelength, so that the wavelength of the second light is controlled to a specific wavelength.

2. The coherent light source according to claim 1, wherein the first light is emitted from a semiconductor laser having a wavelength-variable function.

3. The coherent light source according to claim 2, wherein the semiconductor laser comprises an active region, a phase control region and a distributed Bragg reflection (DBR) region.

4. The coherent light source according to claim 3, wherein the desired wavelength is within a phase-matching wavelength tolerance of the wavelength converting device, and a variation in wavelength of the first light with a change in operating current thereof is compensated by changing current to be input to the phase control region or the DBR region.

5. The coherent light source according to claim 1, wherein the wavelength of the first light is detected after the first light has passed through the wavelength converting device.

6. The coherent light source according to claim 1, wherein the light separator comprises a diffraction grating, and the detector comprises:
    a photo-detector,
    wherein the photo-detector detects the first light diffracted by the diffraction grating, and the wavelength of the first light is controlled so that the angle of diffraction of the diffracted light becomes constant.

7. The coherent light source according to claim 6, wherein the wavelength converting device has an optical waveguide, and the diffraction grating is formed on the optical waveguide.

8. The coherent light source according to claim 6, wherein the photo-detector detects a position of the first light diffracted by the diffraction grating.

9. The coherent light source according to claim 6, wherein the diffraction grating is formed as a chirped grating whose grating pitch is changed depending on location.

10. The coherent light source according to claim 7, wherein the photo-detector is provided on one side of a substrate on which the optical waveguide is formed.

11. The coherent light source according to claim 1, wherein the detector comprises:
    a cesium (Cs) gas cell; and
    a photo-detector,
    wherein the photo-detector detects the first light that has passed through the Cs gas cell, and the wavelength of the first light is controlled so as to minimize the intensity of the first light passing through the Cs gas cell.

12. A recording/reproducing apparatus comprising:
    the coherent light source according to claim 1,
    wherein the coherent light source is adjusted to have an optimum wavelength that meets the Bragg conditions in reproducing hologram information recorded on a medium.

13. A recording/reproducing apparatus comprising:
    the coherent light source according to claim 1 and
    an optical system for focusing light emitted from the coherent light source on an information medium.

14. The coherent light source according to claim 1, wherein the light separator comprises a wavelength separator.

15. A coherent light source comprising:
    a source emitting a first light having a first wavelength; and
    a wavelength converting device for receiving the first light and converting the wavelength of a part of the first light by half by second-harmonic generation due to non-linearity of the wavelength converting device,
    the wavelength converting device converting the part of the first light into a second light having a second wavelength,
    a light separator that separates the first light and the second light,
    a first mechanism that detects the wavelength of the first light that is separated by the light separation mechanism and controls the first light to a desired wavelength, and
    a second mechanism that controls a phase-matching wavelength of the wavelength converting device to the wavelength of the first light,
    wherein the wavelength of the second light is controlled to a specific wavelength.

16. The coherent light source according to claim 15, wherein the phase-matching wavelength of the wavelength converting device is varied by changing a refractive index of the wavelength converting device with electro-optic effect or temperature change.

17. The coherent light source according to claim 15, wherein the wavelength of the first light is detected after the first light has passed through the wavelength convening device.

18. The coherent light source according to claim 15, wherein the light separator comprises a diffraction grating, and the first mechanism comprises:

a photo-detector, wherein the photo-detector detects the first light diffracted by the diffraction grating.

19. The coherent light source according to claim 15, wherein the first mechanism comprises:

a cesium (Cs) gas cell; and a photo-detector, wherein the photo-detector detects the first light that has passed through the Cs gas cell.

20. A recording/reproducing apparatus comprising:

the coherent light source according to claim 15, wherein the coherent light source is adjusted to have an optimum wavelength that meets the Bragg conditions in reproducing hologram information recorded on a medium.

21. A recording/reproducing apparatus comprising:

the coherent light source according to claim 15 and an optical system for focusing light emitted from the coherent light source on an information medium.

22. The coherent light source according to claim 15, wherein the light separator comprises a wavelength separator.

* * * * *